United States Patent [19]

Kim

[11] 3,900,863

[45] Aug. 19, 1975

[54] LIGHT-EMITTING DIODE WHICH GENERATES LIGHT IN THREE DIMENSIONS

[75] Inventor: He B. Kim, Murrysville, Pa.

[73] Assignee: Westinghouse Electric Corporation, Pittsburgh, Pa.

[22] Filed: May 13, 1974

[21] Appl. No.: 469,588

[52] U.S. Cl. ...... 357/17; 357/18;16;56;60; 148/175

[51] Int. Cl.$^2$ ..................... H01L 29/61; H01S 33/19; H01L 29/06; H01L 29/04

[58] Field of Search ............ 357/17, 18, 56, 60, 16; 148/175

[56] References Cited

UNITED STATES PATENTS

| | | | |
|---|---|---|---|
| 3,457,633 | 7/1969 | Marinace | 29/583 |
| 3,462,605 | 8/1969 | Engeler | 250/211 |
| 3,499,158 | 3/1970 | Lavine | 250/217 |
| 3,537,029 | 10/1970 | Kressel | 331/94.5 |
| 3,766,447 | 10/1973 | Mason | 317/235 R |
| 3,780,359 | 12/1973 | Dremke | 317/235 R |

OTHER PUBLICATIONS

Blum et al., *I.B.M. Tech. Bull.*, Vol. 15, No. 2, July 1972, p. 445.

*Primary Examiner*—Martin H. Edlow
*Attorney, Agent, or Firm*—W. D. Palmer

[57] ABSTRACT

Light-emitting diode (LED) device generates light proximate a plurality of different surfaces which lie in different planes. The device is formed on a substrate of a n-type material which carries a thin dielectric masking material thereon with apertures in the mask. Epitaxial facet grown islands project through the apertures and a thin layer of p-type material is formed thereover to provide light-emitting p-n junctions which lie in different planes.

6 Claims, 7 Drawing Figures

LIGHT-EMITTING DIODE WHICH GENERATES LIGHT IN THREE DIMENSIONS

CROSS REFERENCE TO RELATED APPLICATION

In copending application Ser. No. 317,992 filed Dec. 26, 1972 by He B. Kim, the present applicant, and Michael C. Driver, titled "APPLICATION OF FACET-GROWTH TO SELF-ALIGNED SCHOTTKY BARRIER GATE FIELD EFFECT TRANSISTORS," and owned by the present assignee, is disclosed a semiconductor device which is made by epitaxial growth of facets corresponding to the source and drain regions on a surface of a semiconductor body through elongated windows in a masking layer and overgrowing edge portions of the masking layer at the windows to form overgrown portions on the facets. The channel region of the transistor is previously formed in the semiconductor body by epitaxial growth of a layer on a surface of a semiconductor body having a semi-insulating layer adjoining the surface. After removal of the masking layer, the Schottky barrier gate is self-aligned by deposition of metal on the unshielded portions of the planar surface between the facets.

BACKGROUND OF THE INVENTION

This invention relates to light-emitting diodes which generates light in a very efficient manner and, more particularly, to light-emitting diodes which can generate light proximate a plurality of different surfaces which lie in different planes.

The brightness of light-emitting diodes (LEDs) can be improved by enhancement of the internal quantum efficiency and the optical efficiency. The internal quantum efficiency is improved by generating most photons at the junction with injected electrons, and by enhancing the injection efficiency. This is achieved by selection of efficient LED materials and by optimizing the junction formation process. The optical efficiency can be enhanced by efficient extraction of the emitted photons from the radiative recombination region of the diode with a minimum internal reflection loss. The brightness can also be enhanced by concentrating the light-emitting portion into a smaller viewed area.

Most semiconductor LED materials exhibit a high index of refraction and as a result, only a few percent of the internally generated photons will emerge from the crystal to the observer. As an example, the total fraction of light crossing the planar interface of gallium arsenide phosphide and air is 3.8% since gallium arsenide phosphide has an index of refraction of 3.16. An improvement in optical efficiency is theoretically attainable by proper selection of dielectric "lens" material and also lens shape, as disclosed W. N. Carr, article entitled "Photometric Figures of Merit for Semiconductor Luminescent Sources Operating in Spontaneous Mode" Infrared Physics, Volume 6, page 1, 1966.

Conventional lens members for LEDs are normally formed by molding techniques using clear or colored epoxy. The shape of this type lens is optimized for each desired light distribution, magnification, and efficient transmission of light at the interfaces and in the dielectric lens media. In general, the shape of the lens used for commercial LEDs represents a hemisphere to minimize reflection loss and a hemisphere-cylinder combination, with the LED chip located at a near focal plane, is used to provide a desired spatial distribution pattern. In these devices, the LED chip has a planar configuration and light is generated proximate a planar surface.

LEDs having high efficiency and an integral semiconductor lens of hemispherical geometry have been reported by W. N. Carr, article "Characteristics of GaAs Spontaneous Infrared Source with 40 Percent Efficiency", in IEEE Transaction Electrical Devices, ED-12, pg. 531, Oct. 1965. Such devices are quite difficult to make but they do have the advantage of reducing the reflection loss at the interface of the semiconductor/-dielectric.

SUMMARY OF THE INVENTION

There is provided a light-emitting solid-state device (LED) which will generate light proximate a plurality of different surfaces which are in more than one plane. The device comprises a substrate formed of predetermined n-type material having a selected surface of predetermined crystallographic orientation and a thin layer of inorganic dielectric material is adhered over this selected substrate surface. The thin dielectric layer has provided therein at least one aperture of predetermined size and configuration and positioned in predetermined crystallographic orientation with respect to the substrate surface. An epitaxial facet grown island of the n-type material extends from the substrate and projects a predetermined distance through and beyond the aperture in the dielectric layer and a thin p-type layer overlies the portions of the island which projects beyond the aperture in the dielectric layer. The boundary between the n-type material and the p-type material thus defines a multiplanar light-emitting p-n junction. Conventional metallic electrode contacts are made to the p-type layer and to another surface of the substrate.

BRIEF DESCRIPTION OF THE DRAWINGS

For a better understanding of the invention, reference may be had to the preferred embodiment, exemplary of the invention, shown in the accompanying drawings in which.

DESCRIPTION OF THE PREFERRED EMBODIMENTS

Figures 1, 1A:
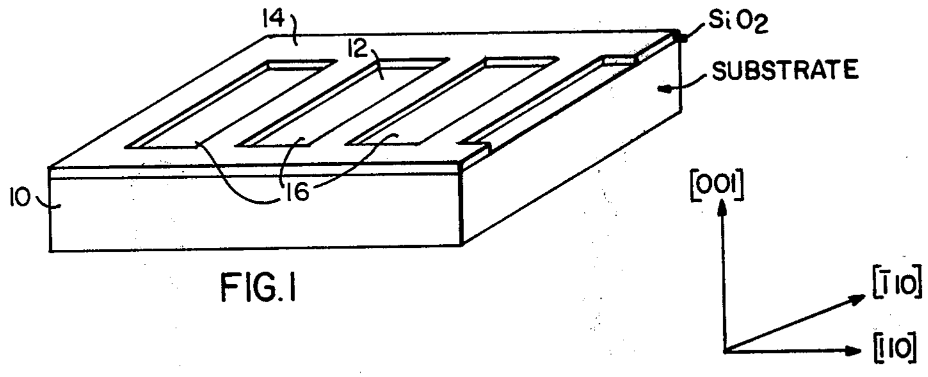
FIG. 1 is an isometric view of an n-type substrate the upper surface of which has a predetermined crystallographic orientation, with a masking layer of silica carried thereon and apertures of predetermined crystallographic orientation in the masking layer.
FIG. 1*a* represents the crystal structure of the substrate of FIG. 1 with the direction of the lines described by Miller indicies shown in brackets.
Figure 2:
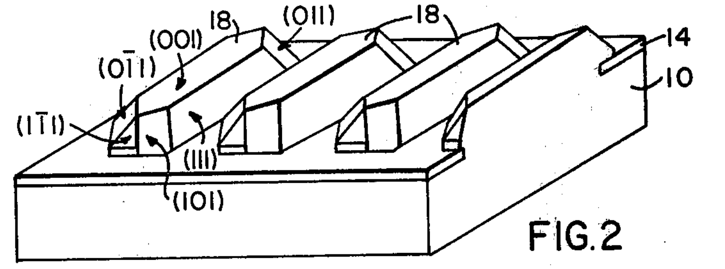
FIG. 2 is an isometric view generally corresponding to FIG. 1 but showing the epitaxial facet-grown islands which are formed of n-type material projecting through the apertures in the mask, with the formed facets having their crystal structure defined by Miller indicies.

Referring to FIG. 1, the n-type substrate 10 preferably has a planar configuration with an upper surface 12 which has a predetermined crystallographic orientation. As a specific example, the upper planar surface 12 has Miller indicies of (001) and the material selected is gallium arsenide having a square configuration with an area of 1.5 square inches (9.7 square cm) and a thickness of 20 mils (0.05 cm). The crystallography of the substrate is preselected in accordance with the type of facet grown island which is desired. In order to grow the structure which is shown in FIG. 2, the n-type gallium arsenide has a crystalline structure which is described by the direction of the lines shown by Miller indicies in FIG. 1*a*.

There is deposited on the surface 12 of substrate 10 a thin layer 14 of inorganic dielectric material, such as silicon dioxide which is applied by the technique of pyrolytic deposition. To apply the silica layer 14, the substrate 10 is placed in an RF furnace and heated to a temperature of 600°C with silane and oxygen flow thereover in such relative amounts as to stoichiometrically react to form silicon dioxide and water. The thickness of silica layer 14 is not critical and as an example is 300nm. Thereafter, the apertures 16 are formed by the technique of photolithogrophy, using a photoresist mask to make the pattern. The masked silica layer is then etched with a mixture of ammonium fluoride and hydrogen fluoride (gram-mole ratio 3:1) to form the apertures 16 which are so positioned on the face 12 of the substrate 10 as to be properly crystallographically oriented in order to provide the proper facet growth.

The foregoing specific example has considered gallium arsenide and other suitable n-type semiconductors can be used, depending upon the energy gap desired. Such other materials are gallium arsenide phosphide, indium phosphide, gallium phosphide, indium arsenide, and gallium indium arsenide, all of which may be processed in accordance with the known technique of vapor phase epitaxy (VPE).

In the next step of preparation of the LED, the epitaxial facet-grown islands 18 are formed as will be described in detail hereinafter. Each of the islands 18 has a predetermined configuration which is dependent upon the crystallographic orientation of the substrate surface 12 and the crystallographic orientation of the apertures 16 in the mask 14. For the specific gallium arsenide n-type material as described, the islands 18 of the n-type gallium arsenide will have the structure as shown in FIG. 2 with the Miller indicies for each planar face also shown on FIG. 2.

Figure 3:
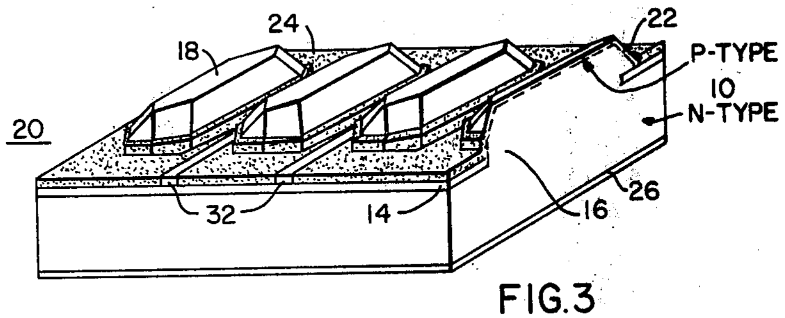
FIG. 3 is an isometric view corresponding to FIG. 2 but showing a finished, monolithic LED array device.
Figure 4:
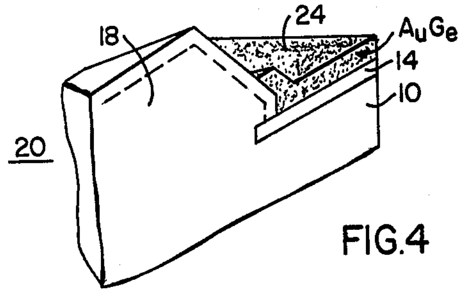
FIG. 4 is an enlarged fragmentary view, shown partly in section, of the device as shown in FIG. 3 illustrating the relative dispositions of the p-type layer, the n-type material and one contacting electrode.

The final monolithic LED array 20 is shown in FIG. 3 and in greater detail in FIG. 4. The islands 18 have a thin layer 22 of p-type material overlapping those portions of the islands 18 which project beyond the apertures 16 in the silica layer 14. To facilitate electrical contact, a first gold-germanium alloy electrode means or layer 24 is adhered to the silica layer 14 and overlays the p-type layer 22. The opposite surface of the substrate 10 is provided with an adhering layer of gold-germanium alloy which forms a second electrode means 26.

Figure 5:
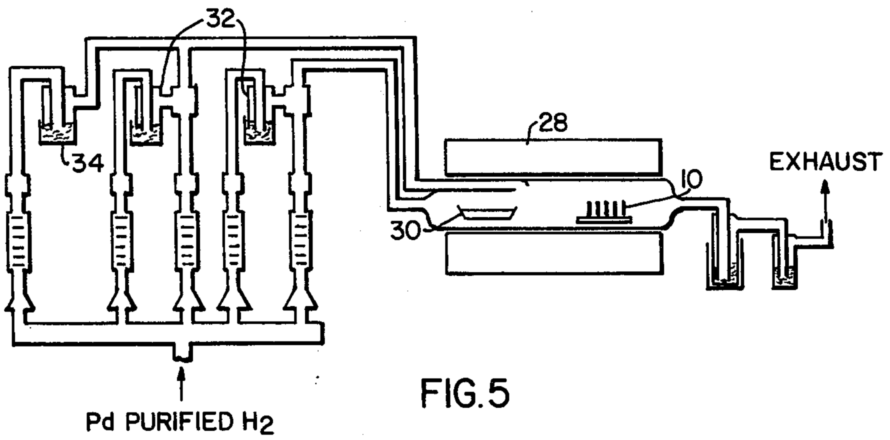
FIG. 5 is a diagrammatic view of an apparatus which can be used to make the device as shown in FIG. 3.

An apparatus for forming the epitaxial facet grown islands is shown in diagrammatic form in FIG. 5. The substrates 10 which have the etched silica masks 14 adhered thereto are mounted in a furnace 28, which also contains gallium metal in a boat 30. The furnace is heated in such manner that the gallium boat is at a temperature of about 800°C and the substrates are at a temperature of about 750°C. Palladium-purified hydrogen is flowed through bubblers 32 which contain arsenic trichloride. At the gases pass over the gallium-containing boat 30, gallium chloride and then gallium trichloride are formed and the gallium trichloride then reacts with the arsenic to form gallium arsenide which deposits within the apertures 16 of the mask 14. Because of the crystallographic orientation, the exact crystalline structure of the substrate is continued as the islands are formed. With a flow rate of approximately 400cc per minute, and coating five substrates at the same time, the gallium arsenide is deposited at a rate of about 3 microns (thickness) per hour, up to a total thickness of approximately 10 microns.

After the gallium arsenide islands 18 are formed, diethyl zinc is introduced by the bubbler 34 into the gaseous stream for 10 to 20 minutes which provides a zinc dopant in thin p-type layer 22 of gallium arsenide. Normally, there will be $10^{19}$ atoms of zinc per cc of crystal. The coated substrates are then cooled and removed from the furnace. A representative thickness of the p-type layer 22 is 0.5 to 1 micron.

The device electrodes 24 and 26 are then applied by conventional vaccum-metalizing techniques and gold-germanium, which makes an ohmic contact, is deposited as a layer 24 onto the exposed silica surface and the edges of the overlaying p-type layer 22. A similar gold-germanium layer 26 is also deposited on the opposite side of the substrate 10. The devices are then heated to approximately 400°C in hydrogen to cause the gold and germanium to alloy. Materials other than these indicated metals can be used to make the electrodes, such as tin, silver-tin alloy, or antimony-doped gold which can be used to make electrode contact to an n-type layer. A representative thickness of the electrode layers is 500nm with the weight ratio of gold to germanium being 88:12.

The array as shown in FIG. 3 incorporates a plurality of epitaxial facet grown islands, each of which forms an LED. The combined islands 18 provide a predetermined array as desired to be visually presented. Of course this array could take many different forms, such as that of an alpha-numeric presentation. The individual LEDS of FIG. 3 can readily be separately energized such as by forming the electrode layer 24 into three electrically insulated segments by removing portions of the formed electrode layer to form insulating stripes 32.

Figure 6:
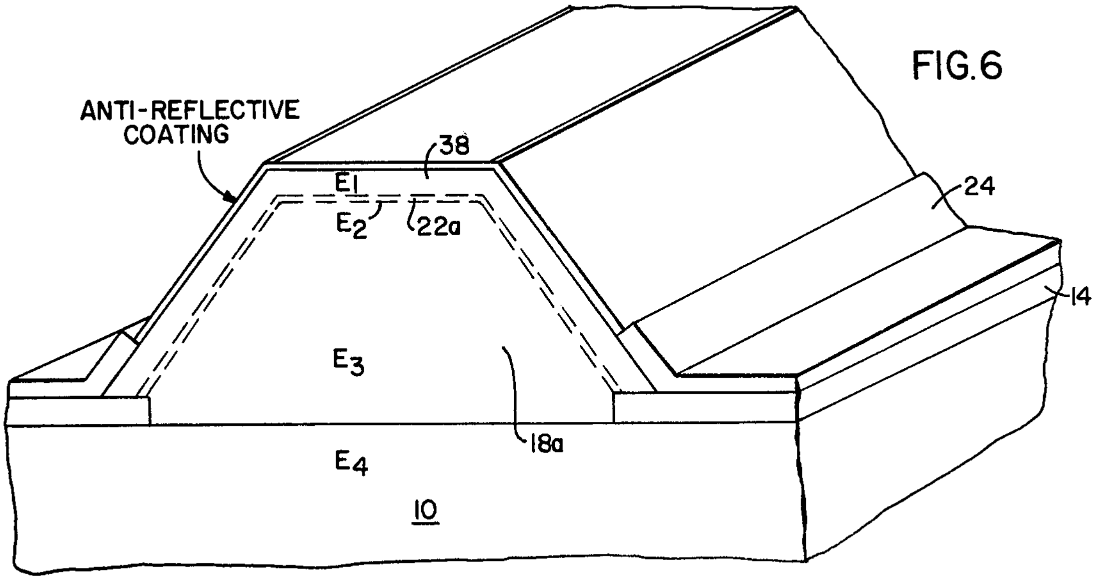
FIG. 6 is an alternative LED structure which is formed with a heterogeneous structure in order to enhance the efficiency of light generation.

Another alternative embodiment is shown in FIG. 6 wherein the epitaxial facet-grown island 18*a* is formed with a "window" layer in order to increase the efficiency of utilization of the generated light. Such a "window" structure is readily attained by epitaxial growth techniques as described by Rupprecht, H, at al "Efficient Electroluminescence from GaAs Diodes at 300°C", Appl. Phys. Lett. 9, 221, September 1966. Efficiencies of 4% have been achieved with a planar structure and over 20% with a sperical dome lens, as described by Ashley, K. L. et al., "Investigation of Liquid-Epitaxial GaAs Spontaneous Light-Emitting Diodes", in GaAs: Proc. 2nd Int. Sym., Dallas, Texas, October 1968. Applying these techniques to the present structures, as shown in FIG. 6, very efficient LEDs can be provided since some of the normally-lost light flux generated can be salvaged because of the critical angles of reflection at the different interfaces, in order to enhance the overall light output. As a specific example, substrate layer 10 is formed of gallium arsenide, as previously described. By introducing varying amounts of phosphorus into the flow gas during the epitaxial facet-growth, different compounds having different energy gaps can be formed. As an example, the island 18*a* is gallium-arsenide phosphide (Ga $As_{0.5}P_{0.5}$) with equal atom amount of arsenic and phosphorus. The layer 22*a*, which constitutes the photon generating layer, is gallium-arsenide phosphide (Ga $As_{0.8}P_{0.2}$) with an atom ratio of arsenic to phosphorus of 4:1. The window layer 38 is gallium-arsenide phosphide (Ga $As_{0.2}P_{0.8}$) with arsenic and phosphorus in the atom ratio of 1:4. A representative thickness in the window layer is 500nm. In this device which is formed of different layers of heterogeneous composition, the island 18*a* has an energy gap ($E_3$) greater than the energy gap ($E_4$) of the substrate 10. The photon-generating, thin, p-type layer 22*a* has an energy gap ($E_2$) less than the energy gap ($E_3$) of the island 18*a*, and the window layer 38 has an energy gap ($E_1$) greater than the energy gap ($E_2$) of the thin p-type layer 22*a*.

As a further alternative embodiment, any of the foregoing structures can be provided with an antireflective coating, such as readily obtained by applying a coating having an index of refraction intermediate that of an epitaxial grown island and air. As an example, in the case of gallium arsenide, a very thin layer of silicon monoxide having a thickness of about 1200 Anstroms will serve as an antireflective coating. In the case of gallium-arsenide phosphide, a silica coating having a thickness of 940 Anstroms will provide the antireflective coating. In the case of gallium phosphide, a clear resin having a thickness 895 Astroms will provide the antireflective coating.

I claim:

1. A light-emitting solid-state device which will generate light proximate a plurality of different surfaces which are in more than one plane, said device comprising:

a. a substrate formed of predetermined n-type material having a selected surface of predetermined crystallographic orientation;

b. a thin layer of inorganic dielectric material adhered over said selected surface of said substrate, said thin layer having provided therein at least one aperture of predetermined size and configuration and positioned in predetermined crystallographic orientation with respect to said selected surface;

c. an epitaxial facet grown island of said n-type material extending from said substrate and projecting a predetermined distance through and beyond the aperture in said dielectric layer;

d. a thin p-type layer overlaying the portions of said island which project beyond the aperture in said dielectric layer, with the boundary between said n-type material and said p-type layer defining a multiplanar light-emitting p-n junction;

e. first metallic electrode means contacting said p-type layer; and f. second metallic electrode means contacting another surface of said substrate.

2. The device as specified in claim 1, wherein there are provided a plurality of said apertures in said dielectric material layer, said apertures when viewed in combination providing a predetermined array desired to be visually presented, each of said apertures have one of said epitaxial facet grown islands projecting therethrough, and said first metallic electrode means comprising a plurality of different electrodes adapted to be separately energized.

3. The device as specified in claim 1, wherein said epitaxial facet grown island has a predetermined faceted lens structure.

4. The device as specified in claim 3, wherein at least a portion of said faceted lens structure has provided thereon a thin layer of material having an index of refraction intermediate the indicies of refraction of said p-type layer and air.

5. The device as specified in claim 1, wherein said substrate is gallium-arsenide and of flattened configuration, with the crystalline Miller indicies of said selected surface being (001); said dielectric material is silica affixed to said selected surface; said p-type layer is zinc doped gallium-arsenide; said first metallic electrode means is gold-germanium alloy; and said second metallic electrode means is gold-germanium alloy and is affixed to a surface of said substrate opposite said silica layer.

6. The device as specified in claim 1, wherein said device is formed of different layers of heretrogeneous composition, said island is different composition than said substrate and said island has an energy gap greater than the energy gap of said substrate, said thin p-type layer has an energy gap less than the energy gap of said island, a window layer of p-type material of composition different from that of said thin p-type layer overlays said thin p-type layer, and said window layer has an energy gap greater than that of said thin p-type layer.

* * * * *